United States Patent
Kong

(10) Patent No.: US 7,674,708 B2
(45) Date of Patent: Mar. 9, 2010

(54) METHOD FOR FORMING FINE PATTERNS OF A SEMICONDUCTOR DEVICE

(75) Inventor: Keun Kyu Kong, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 179 days.

(21) Appl. No.: 11/733,937

(22) Filed: Apr. 11, 2007

(65) Prior Publication Data

US 2008/0009137 A1 Jan. 10, 2008

(30) Foreign Application Priority Data

Jul. 10, 2006 (KR) .................. 10-2006-0064399

(51) Int. Cl.
H01L 21/31 (2006.01)
H01L 21/00 (2006.01)
(52) U.S. Cl. .............. 438/633; 257/E21.038; 430/313
(58) Field of Classification Search .......... 438/633, 438/689, 690, 691, 694, 697, 699, 735, 959; 257/E21.023, E21.038, E21.039; 430/269, 430/313, 311, 314, 317, 323
See application file for complete search history.

(56) References Cited

U.S. PATENT DOCUMENTS

| 6,503,828 | B1* | 1/2003 | Nagahara et al. ............. 438/633 |
| 2004/0195620 | A1* | 10/2004 | Chuang et al. ............... 257/335 |
| 2006/0046484 | A1* | 3/2006 | Abatchev et al. ............ 438/689 |
| 2006/0204899 | A1* | 9/2006 | Kushibiki et al. ........... 430/313 |
| 2006/0216938 | A1* | 9/2006 | Miyagawa et al. .......... 438/692 |
| 2007/0287299 | A1* | 12/2007 | Lee et al. ..................... 438/761 |

FOREIGN PATENT DOCUMENTS

| JP | 10-41212 | 2/1998 |
| KR | 10-1998-021248 | 6/1998 |
| KR | 1020060075333 A | 7/2006 |
| WO | WO 2006059851 A1 | 6/2006 |

OTHER PUBLICATIONS

H. Savvides, "Optical constants and associated functions of metastable diamondlike amorphous carbon films in the energy range 0.5-7.3 eV", 1986, J.Applied Physics, vol. 59, No. 12, pp. 4133-4145.*
S. A. Campbell, "The Science and Engineering of Microelectronic Fabrication", 2001, Oxford University Press, pp. 191-194.*

* cited by examiner

Primary Examiner—Thomas L Dickey
Assistant Examiner—Nikolay Yushin
(74) Attorney, Agent, or Firm—Townsend and Townsend and Crew LLP

(57) ABSTRACT

A method for forming a fine pattern of a semiconductor device overcomes resolution limits of exposure equipment. The method includes forming a first photoresist pattern over an underlying layer formed over a semiconductor substrate. An amorphous carbon film and a second photoresist film are sequentially deposited over the first photoresist pattern. The second photoresist film and the amorphous carbon film are planarized to expose the first photoresist pattern. A thick portion and a thin portion of the amorphous carbon film is formed. The first photoresist pattern and the second photoresist film are removed. Etching is performed on the thin portion of the amorphous carbon film and the underlying layer using the thick portion of the amorphous carbon film as an etch mask. The thick portion of the amorphous carbon film is removed to expose a fine pattern of the underlying layer.

15 Claims, 3 Drawing Sheets

METHOD FOR FORMING FINE PATTERNS OF A SEMICONDUCTOR DEVICE

CROSS-REFERENCE TO RELATED APPLICATIONS

The present application claims priority to Korean patent application number 10-2006-64399, filed on Jul. 10, 2006, which is incorporated by reference in its entirety.

BACKGROUND OF THE INVENTION

1. Field of the Invention

The present invention relates to a method for forming fine patterns of a semiconductor device, and more specifically, to a method for forming fine patterns of a semiconductor device which overcomes resolution limits of exposure equipment.

2. Description of the Related Art

Lithography resolution (R) for a lithography process is determined by a relationship of a wavelength (λ) of a light source used in exposure equipment and a numerical aperture (NA) as expressed in the following equation:

$$R = k1 \times \lambda / NA$$

In the equation, k1 indicates a process factor and has a physical (optical) limit, e.g., k1=0.25. Conventional resolution enhancement techniques cannot surpass this limit.

ArF exposure equipment with a 0.93 numerical aperture has recently been developed. With additional technical advances in photoresist material and masking, it is now possible to form a 60 nm pattern. However, forming a pattern of less than 60 nm is difficult because a pitch is reached where light that includes image information cannot penetrate.

Therefore, forming a line and space pattern of less than 60 nm requires ArF immersion lithography.

SUMMARY OF THE INVENTION

The present invention provides a method for forming a fine pattern of a semiconductor device which overcomes resolution limits of exposure equipment. The method includes forming a first photoresist pattern over an underlying layer formed over a semiconductor substrate. The first photoresist pattern comprises lines with spaces defined between the lines. An amorphous carbon film is deposited over the first photoresist pattern and the underlying layer that is exposed between the lines of the first photoresist pattern. The thickness of the amorphous carbon film is substantially uniform. A second photoresist film is deposited over the amorphous carbon film. The second photoresist film fills the spaces defined between the lines of the first photoresist pattern. The second photoresist film and the amorphous carbon film are planarized to expose the first photoresist pattern. The amorphous carbon film is formed to have a thick portion between the exposed first photoresist pattern and the second photoresist film and a thin portion between the underlying layer and the second photoresist film. The first photoresist pattern and the second photoresist film are removed. The thin portion of the amorphous carbon film and the underlying layer are etched using the thick portion of the amorphous carbon film as an etch mask. The thick portion of the amorphous carbon film is removed to expose a fine pattern of the underlying layer.

The deposition thickness of the amorphous carbon film is a critical dimension of the final pattern of the underlying layer. Preferably, the amorphous carbon film is deposited at a temperature of approximately 100 to 250° C. to a thickness in a range of approximately 10 to 50 nm.

The second photoresist film is deposited over the amorphous carbon film by spin coating to a thickness in a range of approximately 100 to 1000 nm. The second photoresist film is then baked at a temperature of approximately 110° C.

The second photoresist film and the amorphous carbon film are planarized by blank-etching the second photoresist film and the amorphous carbon film using the first photoresist pattern as an etching barrier. Alternatively, the second photoresist film and the amorphous carbon film are planarized by chemical mechanical polishing the second photoresist film and the amorphous carbon film using the first photoresist pattern as a polishing barrier.

According to the present invention, a fine line/space pattern can be formed on a semiconductor device that overcomes resolution limits of exposure equipment by forming, on a first photoresist pattern, an amorphous carbon film and a second photoresist film, and then etching.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

A pattern formation method based on a double exposure process of the present invention will be described in detail with reference to FIGS. 1a through 1g.

Figure 1A:
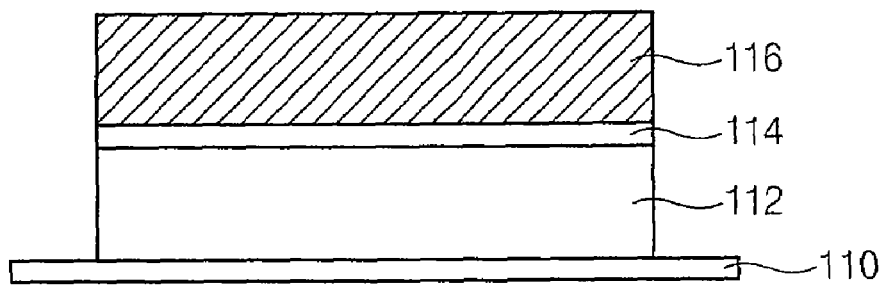
FIG. 1a through FIG. 1g are cross-sectional views illustrating the construction of a semiconductor device using a fine pattern formation process of the present invention.

Referring to FIG. 1a, an underlying layer 112, an antireflection film 114, and a first photoresist film 116 are sequentially formed over a semiconductor substrate 110. In one embodiment, the underlying layer 112 is formed with a thickness of approximately 300 nm, the antireflection film 114 is formed with a thickness of approximately 40 nm, and the first photoresist film 116 is formed with a thickness of approximately 170 nm. In one embodiment, the underlying layer 112 is an oxide film.

Figure 1B:
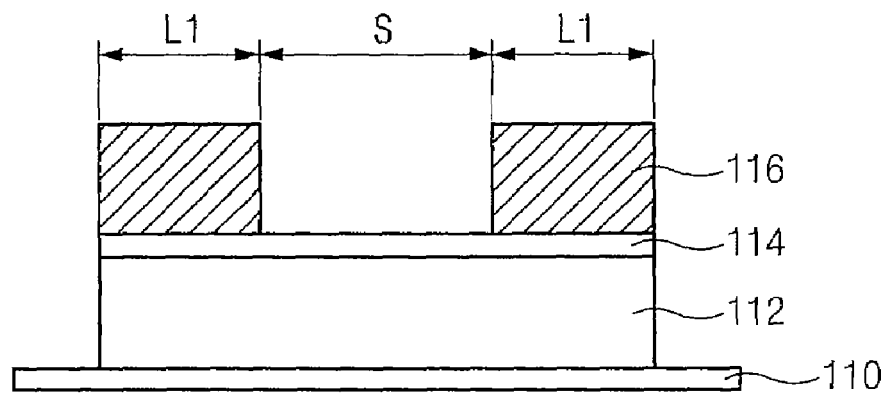

Referring to FIG. 1b, the first photoresist film 116 is patterned to form a line (having bar length L1) and a space pattern (having space length S) using an ArF light source. In one embodiment, L1=80 nm and S=100 nm.

Figure 1C:
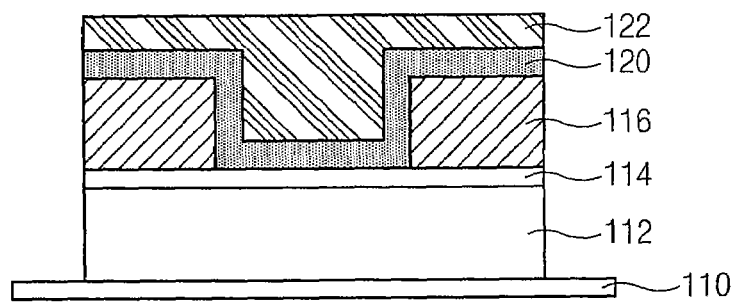

Referring to FIG. 1c, an amorphous carbon film 120 is deposited with a substantially uniform thickness over the first photoresist pattern 116 and over a portion of the antireflection film 114 that is exposed between lines of the first photoresist pattern 116. In one embodiment, amorphous carbon film 120 is deposited using a low-temperature process at approximately 110 to 250° C. In another embodiment, the amorphous carbon film 120 has a thickness of approximately 10 to 50 nm from the surface of the first photoresist pattern 116 or the antireflection film 114. A second photoresist film 122 is deposited over the amorphous carbon film 120 to fill a space defined between lines of the first photoresist pattern 116. In one embodiment, the second photoresist film 122 is formed by spin coating to a thickness in a range of approximately 100 to 1000 nm over the amorphous carbon film 120. In another embodiment, the second photoresist film 122 is baked to a temperature of approximately 110° C.

Figure 1D:
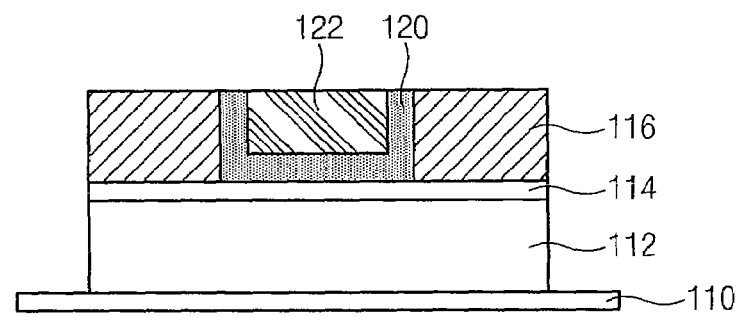

A planarization process is performed on the second photoresist film 122 and the amorphous carbon film 120 until the first photoresist pattern 116 is exposed to obtain a structure as shown in FIG. 1d. In one embodiment, the planarization process is performed by blank-etching the second photoresist film 122 and the amorphous carbon film 120 using the first photoresist pattern 116 as an etching barrier. In another embodiment, chemical mechanical polishing is performed on the second photoresist film 122 and the amorphous carbon film 120 using the first photoresist pattern 116 as a polishing barrier.

Figure 1E:
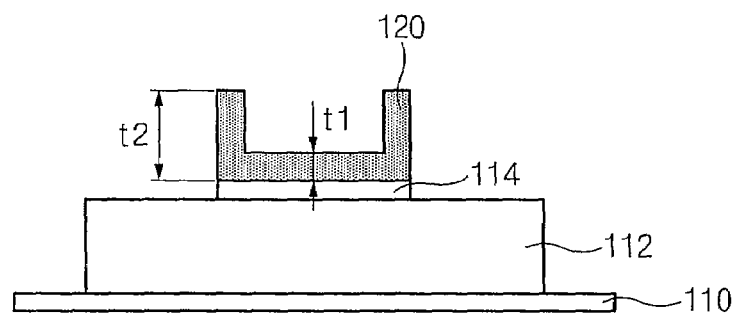

Referring to FIG. 1e, the first photoresist pattern 116 and the second photoresist film 122 are removed such that only the amorphous carbon film 120 and the underlying antireflection film 114 remain on the underlying layer 112. The amorphous carbon film 120 includes a thin portion (t1) and a thick portion (t2). The thin portion (t1) is formed between the surface of the antireflection film 114 and the second photoresist film 122. The thick portion (t2) is formed between the surface of the first photoresist pattern 116 exposed during planarization and the second photoresist film 122.

Figure 1F:
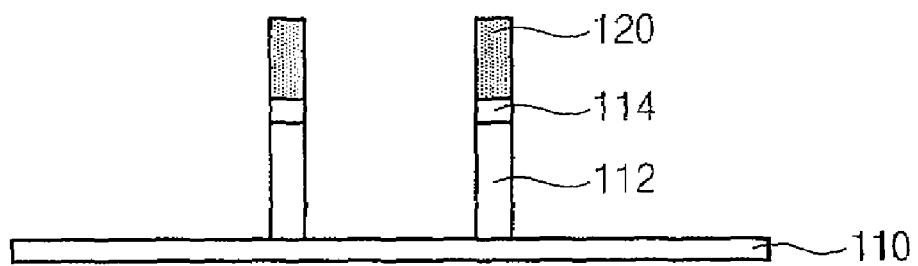

Referring to FIG. 1f, the thin portion of the amorphous carbon film 120, the antireflection film 114 and the underlying layer 112 are etched using the thick portion of the amorphous carbon film 120 as an etching mask. In one embodiment, the etching is performed using a dry etch process.

Figure 1G:
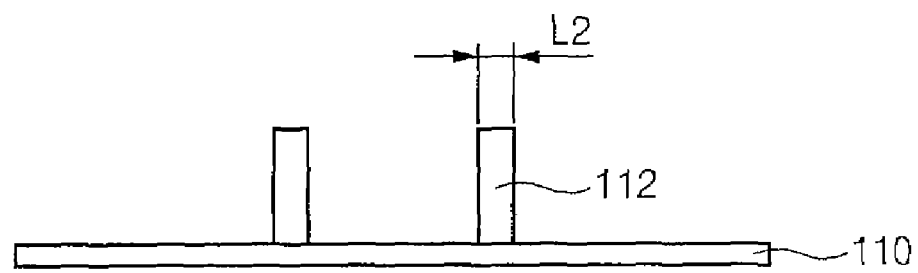

Referring to FIG. 1g, when the thick portion of the amorphous carbon film 120 and the antireflection film 114 are removed, a fine pattern is formed having a line width (L2) that is the same as the deposition thickness of the amorphous carbon film 120. In one embodiment, the line width (L2) is approximately 20 nm.

The resulting line width is a very fine pattern that cannot be obtained at the resolution of exposure equipment. In other words, the application of the present process makes it possible to form fine patterns that overcome resolution limits of exposure equipment.

Although the preferred embodiment of the present invention has been described, it will be understood by those skilled in the art that the present invention should not be limited to the described preferred embodiment, but various changes and modifications can be made within the spirit and scope of the present invention as defined by the appended claims.

What is claimed is:

1. A method for forming a pattern of a semiconductor device, the method comprising:
   forming a first photoresist pattern over an underlying layer formed over a semiconductor substrate, wherein the first photoresist pattern comprises lines with spaces defined between the lines;
   depositing an amorphous carbon film over the first photoresist pattern and the underlying layer that is exposed between the line-type patterns of the first photoresist pattern, wherein the thickness of the amorphous carbon film is substantially uniform;
   depositing a second photoresist film over the amorphous carbon film, wherein the second photoresist film fills the spaces defined between the lines of the first photoresist pattern;
   planarizing the second photoresist film and the amorphous carbon film until the first photoresist pattern is exposed, so as to form the amorphous carbon film including a thick portion between the exposed first photoresist pattern and the second photoresist film and a thin portion between the underlying layer and the second photoresist film;
   removing the first photoresist pattern and the second photoresist film;
   etching the thin portion of the amorphous carbon film and the underlying layer using the thick portion of the amorphous carbon film as an etch mask; and
   removing the thick portion of the amorphous carbon film to expose a fine pattern of the underlying layer.

2. The method of claim 1, wherein the amorphous carbon film is deposited at a temperature of approximately 100 to 250° C.

3. The method of claim 1, wherein the amorphous carbon film is deposited to a thickness in a range of approximately 10 to 50 nm.

4. The method of claim 1, wherein depositing the second photoresist film comprises:
   spin coating the second photoresist film to a thickness in a range of approximately 100 to 1000 nm over the amorphous carbon film, and
   baking at a temperature of approximately 110° C.

5. The method of claim 1, wherein planarizing the second photoresist film and the amorphous carbon film comprises blank-etching the second photoresist film and the amorphous carbon film using the first photoresist pattern as an etching barrier.

6. The method of claim 1, wherein planarizing the second photoresist film and the amorphous carbon film comprises chemical mechanical polishing the second photoresist film and the amorphous carbon film using the first photoresist pattern as a polishing barrier.

7. The method of claim 1, wherein the underlying layer comprises an oxide film.

8. The method of claim 1, further comprising forming an antireflection film over the underlying layer, wherein the first photoresist pattern is formed over the antireflection film.

9. The method of claim 1, wherein etching the thin portion of the amorphous carbon film and the underlying layer comprises dry etching.

10. A method for forming a semiconductor device, comprising:
    providing a first photoresist pattern having a plurality of lines formed over an underlying layer;
    depositing an amorphous carbon film on a top surface and sidewalls of the first photoresist pattern and an exposed portion of the underlying layer, wherein the thickness of the amorphous carbon film is substantially uniform;
    depositing a second photoresist film over the amorphous carbon film;
    planarizing the second photoresist film and the amorphous carbon film until the first photoresist pattern is exposed;
    removing the first photoresist pattern and the second photoresist film;
    etching both the amorphous carbon film and the underlying layer in a vertical direction using a vertical thickness difference of the amorphous carbon film as an etch barrier.

11. The method according to claim 10, further comprising:
    forming an antireflection film over the underlying layer, wherein the first photoresist pattern is formed on the antireflection film.

12. The method of claim 10, wherein the underlying layer comprises an oxide film formed over a semiconductor substrate.

13. The method of claim 10, wherein the substantially uniform thickness of the amorphous carbon film is thinner than a thickness of the first photoresist pattern.

14. The method of claim 13, wherein the amorphous carbon film is deposited to a thickness in a range of approximately 10 to 50 nm.

15. The method of claim 10, wherein the substantially uniform thickness of the amorphous carbon film is substantially equal to a width of the etch barrier.

* * * * *